United States Patent
Park et al.

(10) Patent No.: US 7,499,310 B2
(45) Date of Patent: Mar. 3, 2009

(54) BIT LINE VOLTAGE SUPPLY CIRCUIT IN SEMICONDUCTOR MEMORY DEVICE AND VOLTAGE SUPPLYING METHOD THEREFOR

(75) Inventors: Chul-Sung Park, Seoul (KR); Young-Seung Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 282 days.

(21) Appl. No.: 11/332,605

(22) Filed: Jan. 13, 2006

(65) Prior Publication Data

US 2006/0158943 A1 Jul. 20, 2006

(30) Foreign Application Priority Data

Jan. 14, 2005 (KR) ........................ 10-2005-0003582

(51) Int. Cl.
  *G11C 11/00* (2006.01)
  *G11C 5/14* (2006.01)
(52) U.S. Cl. ..................... 365/154; 365/190; 365/227
(58) Field of Classification Search .................. 365/154
  See application file for complete search history.

(56) References Cited

U.S. PATENT DOCUMENTS

| | | | | |
|---|---|---|---|---|
| 5,157,631 A | * | 10/1992 | Shimogawa | 365/203 |
| 5,267,214 A | * | 11/1993 | Fujishima et al. | 365/230.03 |
| 5,933,373 A | * | 8/1999 | Takahashi | 365/189.06 |
| 6,347,058 B1 | * | 2/2002 | Houghton et al. | 365/203 |
| 6,901,016 B2 | * | 5/2005 | Miyashita et al. | 365/203 |
| 7,272,061 B2 | * | 9/2007 | Saleh | 365/203 |
| 2005/0276134 A1 | * | 12/2005 | Mori et al. | 365/203 |
| 2006/0098469 A1 | * | 5/2006 | Yang et al. | 365/63 |
| 2006/0215479 A1 | * | 9/2006 | Lee | 365/230.06 |

* cited by examiner

*Primary Examiner*—Son L Mai
(74) *Attorney, Agent, or Firm*—F. Chau & Associates, LLC

(57) ABSTRACT

There is provided a bit line voltage supply circuit for reducing leakage current flowing from bit lines to a memory cell without substantially deteriorating the performance of a semiconductor memory device. A bit line voltage switch applies a first supply voltage to a bit line pair in response to a first switch control signal, and applies a second supply voltage having a lower voltage than the first supply voltage to the bit line pair in response to a second switch control signal. A bit line voltage controller controls the first and second switch control signals so that the second supply voltage is supplied to the bit line pair during a standby mode, and the first supply voltage is supplied to the bit line pair when the semiconductor memory device changes from the standby mode to an operational mode for a predetermined time period.

8 Claims, 10 Drawing Sheets

BIT LINE VOLTAGE SUPPLY CIRCUIT IN SEMICONDUCTOR MEMORY DEVICE AND VOLTAGE SUPPLYING METHOD THEREFOR

CROSS-REFERENCE TO RELATED APPLICATION

This application claims the benefit of Korean Patent Application No. 10-2005-0003582, filed Jan. 14, 2005, the disclosure of which is incorporated herein by reference in its entirety.

BACKGROUND OF THE INVENTION

1. Technical Field

The present invention relates to a voltage supply for bit lines, and more particularly, to a bit line voltage supply circuit in a volatile semiconductor memory device and a voltage supplying method therefor.

2. Discussion of Related Art

To achieve higher performance in electronic systems such as personal computers or electronic communication devices, volatile semiconductor memory devices such as static random access memories (SRAM) are more highly integrated with higher response speed. Since semiconductor memory devices installed in battery operated systems such as hand held telephones or notebook computers benefit from low power consumption characteristics, semiconductor device manufacturers are reducing operating current and standby current to provide a mobile-oriented low power solution.

FIG. 1 is a circuit diagram of a memory cell of a conventional static random access memory. With reference to FIG. 1, a memory cell of a static random access memory (SRAM) is typically comprised of six CMOS transistors, including first and second load transistors P1 and P2, first and second driver transistors N1 and N2, and first and second access (pass) transistors N3 and N4. According to a tendency toward higher integration of semiconductor memory devices, when the cell density of an SRAM is further increased to a limit of resolution of a photolithography process, the six CMOS transistors may be situated on different layers. One memory cell MC functions as a single memory unit capable of storing one bit of data (0 or 1). A supply voltage Vdd is applied to source terminals of the first and second load transistors P1 and P2. Drain (or source) terminals of the first and second pass transistors N3 and N4 are connected to a bit line pair comprised of a bit line BL and a complementary bit line BLb, respectively.

FIG. 2 is a circuit diagram showing a core cell array of a conventional static random access memory having a plurality of memory cells as shown in FIG. 1. As in FIG. 2, a plurality of memory cells MC1 to MCn and a precharge and equalization section 100 are connected to a bit line pair BL and BLb. First, second, third and fourth column pass gates MP1, MP2, MN1 and MN2 are coupled with the bit line pair BL and BLb to connect the bit line pair BL and BLb with read and write section data line pairs RSDL, RSDLb, WSDL and WSDLb. More specifically, the first and second column pass gates MP1 and MP2, typically comprised of pMOS transistors, transfer cell data from the bit line pair BL and BLb to the read section data line pair RSDL and RSDLb, respectively, in response to a complementary column select signal Yb. The third and fourth column pass gates MN1 and MN2, typically comprised of nMOS transistors, transfer write data provided from a write driver connected to the write section data line pair WSDL and WSDLb, to the bit line pair BL and BLb, respectively, in response to a column select signal Y.

Because a precharge and equalization control signal YEQ applied to the precharge and equalization section 100 becomes a logic low during a standby mode, the bit line pair BL and BLb is precharged to the supply voltage Vdd through activation of first through third precharge transistors PP1 to PP3, which are typically pMOS transistors. Accordingly, leakage current flowing through the first and second pass transistors N3 and N4 of a memory cell MC occurs during a standby mode.

That is, when the semiconductor memory device operates in a standby mode, the bit line pair BL and BLb is precharged to a supply voltage Vdd and a leakage current flows into the first and second pass transistors N3 and N4 from the bit line pair BL and BLb to ground through two paths A1 and A2. Thus, two paths A1 and A2 of leakage current are formed between the bit line pair BL and BLb and ground through the first and second pass transistors N3 and N4, respectively.

Furthermore, source-drain channels of the first and second load transistors P1 and P2 provide additional paths for leakage current. Because the supply voltage Vdd is applied to the source terminals of the first and second load transistors P1 and P2 to maintain data storage, a memory cell power leakage current also flows through the first and second load transistors P1 and P2.

Conventional methods to reduce leakage current flowing through the first and second load transistors P1 and P2, include applying a voltage lower than the level of the supply voltage Vdd as the memory cell power voltage during a standby mode, and applying the supply voltage Vdd as the memory cell power voltage during an operational mode.

However, the conventional methods for reducing leakage current reduce only a standby current flowing through the first and second load transistors P1 and P2 of a memory cell MC. However, the conventional methods do not reduce leakage current flowing from a bit line pair BL and BLb to ground through the first and second pass transistors N3 and N4. As a result, there is a limitation on the reduction of standby current in a standby mode by means of the conventional methods.

Accordingly, what is desired is a circuit capable of reducing leakage current flowing from bit lines to a memory cell without deteriorating the performance of a semiconductor memory device such as employed in battery operated systems.

SUMMARY OF THE INVENTION

The present invention provides a semiconductor memory device that reduces current consumption in a standby mode without substantially deteriorating the device characteristics.

An embodiment of the present invention provides a bit line voltage supply circuit in a semiconductor memory device and a voltage supplying method therefor, which reduce leakage current flowing through access transistors during a standby mode.

Another embodiment of the present invention provides an apparatus and method which control a precharge voltage applied to bit lines in a static random access memory with a CMOS memory cell at an optimal level according to a standby mode and an operational mode.

Another embodiment of the present invention provides a bit line voltage supply circuit in a semiconductor memory device and a voltage supplying method therefor, which reduce leakage current flowing through an access transistor of a memory cell and reduce wake up time with respect to an operating voltage when the semiconductor memory device changes to an operational mode.

Another embodiment of the present invention provides a method for supplying a voltage to bit lines, which applies a standby voltage as a precharge voltage of the bit lines in the case that a standby mode is held when a memory cell block is not selected, whereby a standby current may be reduced without deteriorating the operational characteristics of a device.

Another embodiment of the present invention provides an apparatus and a method, which allow a precharge voltage of bit lines to be returned to a stable operation voltage level without deteriorating operation characteristics when a semiconductor memory device changes from a standby mode to an operational mode.

In accordance with an exemplary embodiment, the present invention provides a bit line voltage supply circuit in a semiconductor memory device, including a bit line voltage switch for applying a first supply voltage to a bit line pair in response to a first switch control signal, and for applying a second supply voltage having a level lower than that of the first supply voltage to the bit line pair in response to a second switch control signal; and a bit line voltage controller for controlling the first and second switch control signals so that the second supply voltage is supplied to the bit line pair in a standby mode, and the first supply voltage is supplied to the bit line pair when the semiconductor memory device changes from the standby mode to an operational mode for a predetermined time period.

In accordance with another embodiment of the present invention, there is provided a bit line voltage supply circuit in a semiconductor memory device, including a bit line precharge section connected to a bit line pair and being non-operative during a standby mode in response to a precharge interrupt control signal; a data line voltage switch connected to a data line pair for applying a first supply voltage to the bit line pair through a column pass gate in response to a first switch control signal, and for applying a second supply voltage having a level lower than that of the first supply voltage to the bit line pair through the column pass gate in response to a second switch control signal; and a data line voltage controller for controlling the precharge interrupt control signal and the first and second switch control signals, enabling the second supply voltage to be supplied to the bit line pair in a standby mode and the first supply voltage to be supplied to the bit line pair when the semiconductor memory device changes from the standby mode to an operational mode for a predetermined time period.

The bit line voltage switch may include first and second precharge transistors having source terminals that are connected to the first supply voltage, having drain terminals that are each connected to one of the bit lines of the bit line pair, and having gates for receiving the first switch control signal; and first and second drive transistors having sources that are connected to the second supply voltage, having drains that are each connected to one of the bit lines of the bit line pair, and having gates for receiving the second switch control signal. An equalization transistor including a gate for receiving the first switch control signal may be further provided, and a source-drain channel of the equalization transistor may be connected between the drains of the first and second precharge transistors.

The semiconductor memory device may be a static random access memory, and the static random access memory may include a plurality of memory cells, each memory cell having six cell transistors, and the six cell transistors may be a three-dimensional memory cell that is formed on different conductive layers. In this embodiment, the bit line voltage controller may include a Y-main decoder for generating the first switch control signal as an equalization and precharge control signal using a block select signal, a bit line select signal, and a chip select association signal; and a bit line level controller for generating the chip select association signal and the second switch control signal in response to the block select signal and a chip select signal.

BRIEF DESCRIPTION OF THE DRAWINGS

The above and other features of the present invention will become more apparent by describing preferred embodiments with reference to the attached drawings in which.

DETAILED DESCRIPTION OF PREFERRED EMBODIMENTS

Figure 1:
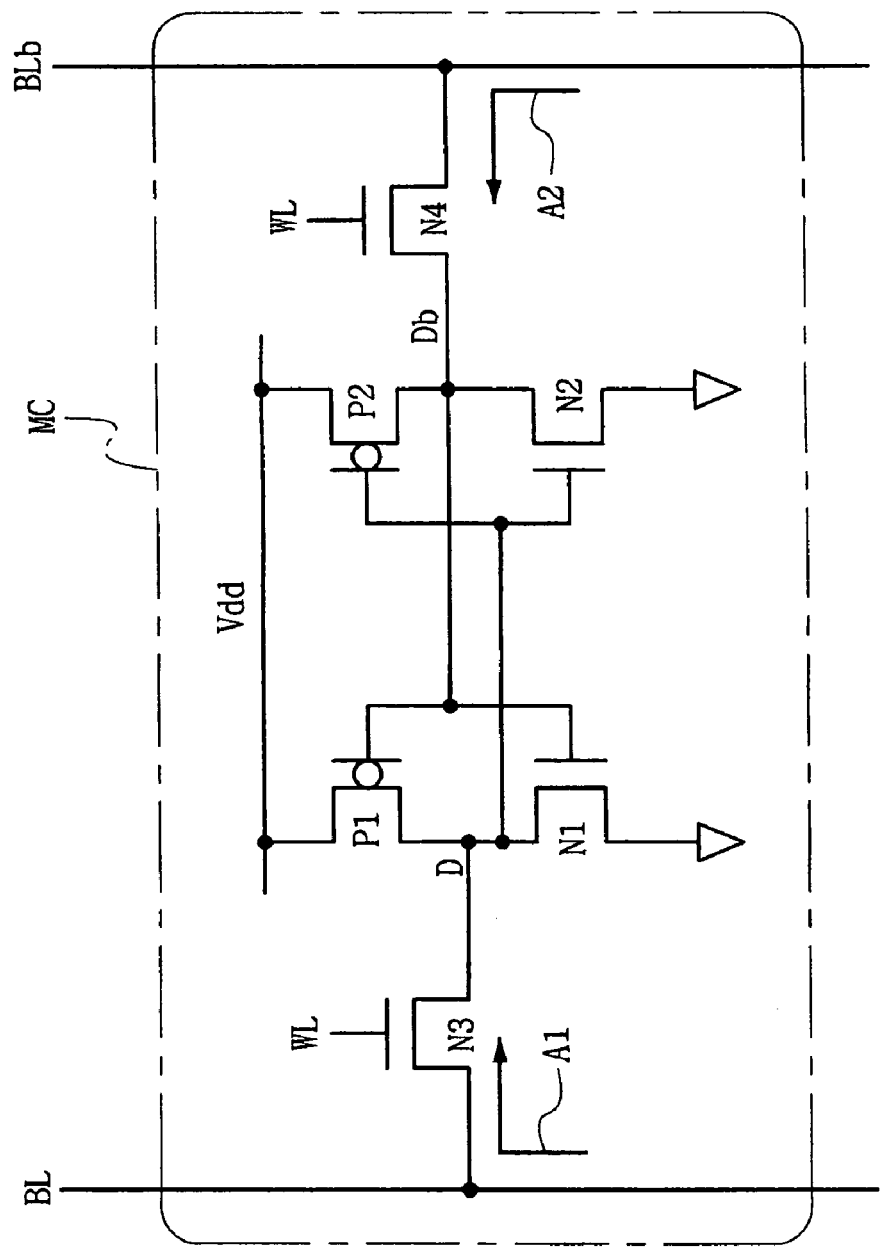
FIG. 1 is a circuit diagram of a memory cell of a conventional static random access memory.

Exemplary embodiments of the present invention will now be described with reference to the accompanying drawings. However, the invention should not be limited to the embodiments set forth herein. In the drawings, like numerals refer to like elements.

Figure 2:
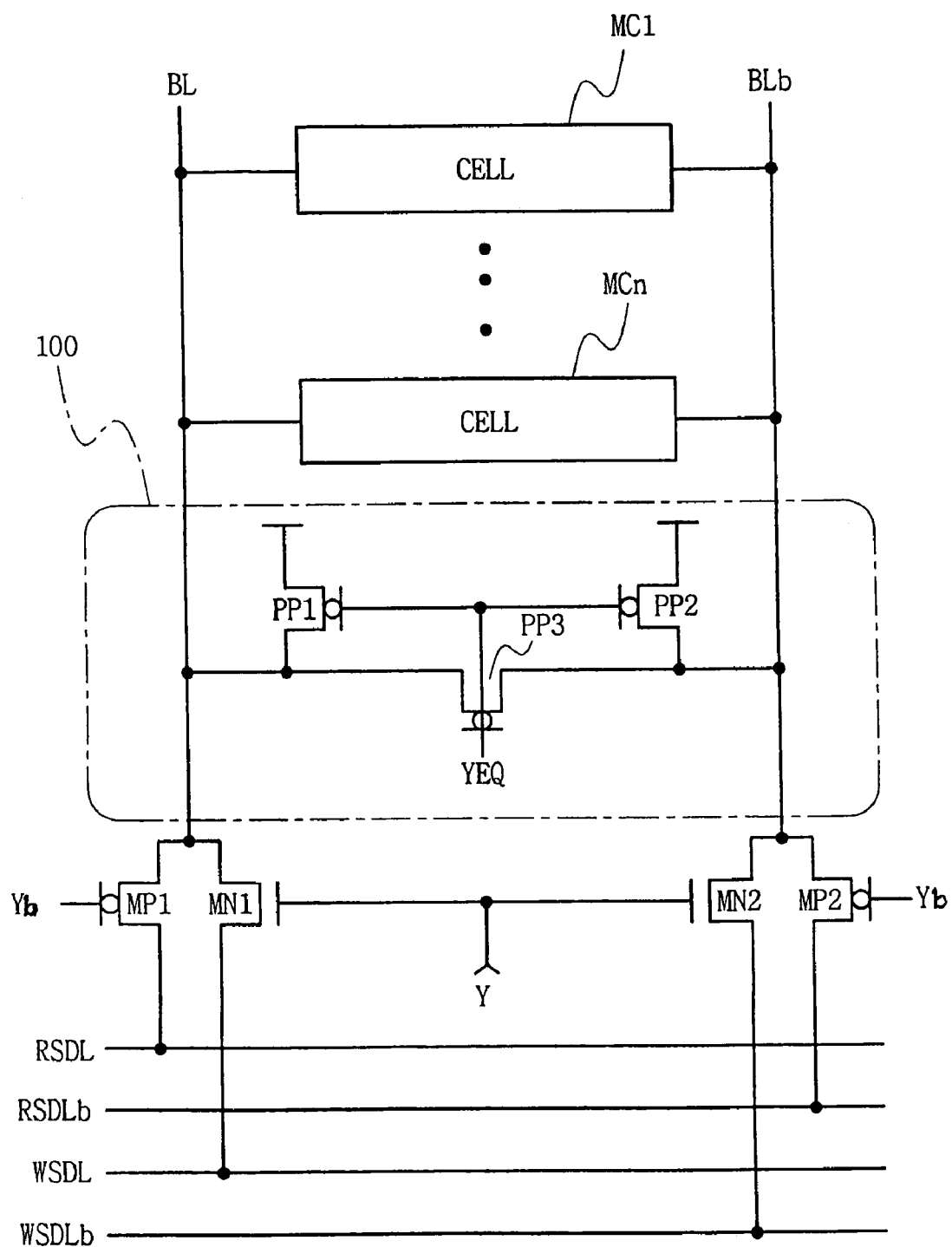
FIG. 2 is a circuit diagram showing a core cell array of a conventional static random access memory having a plurality of memory cells as shown in FIG. 1.
Figure 3:
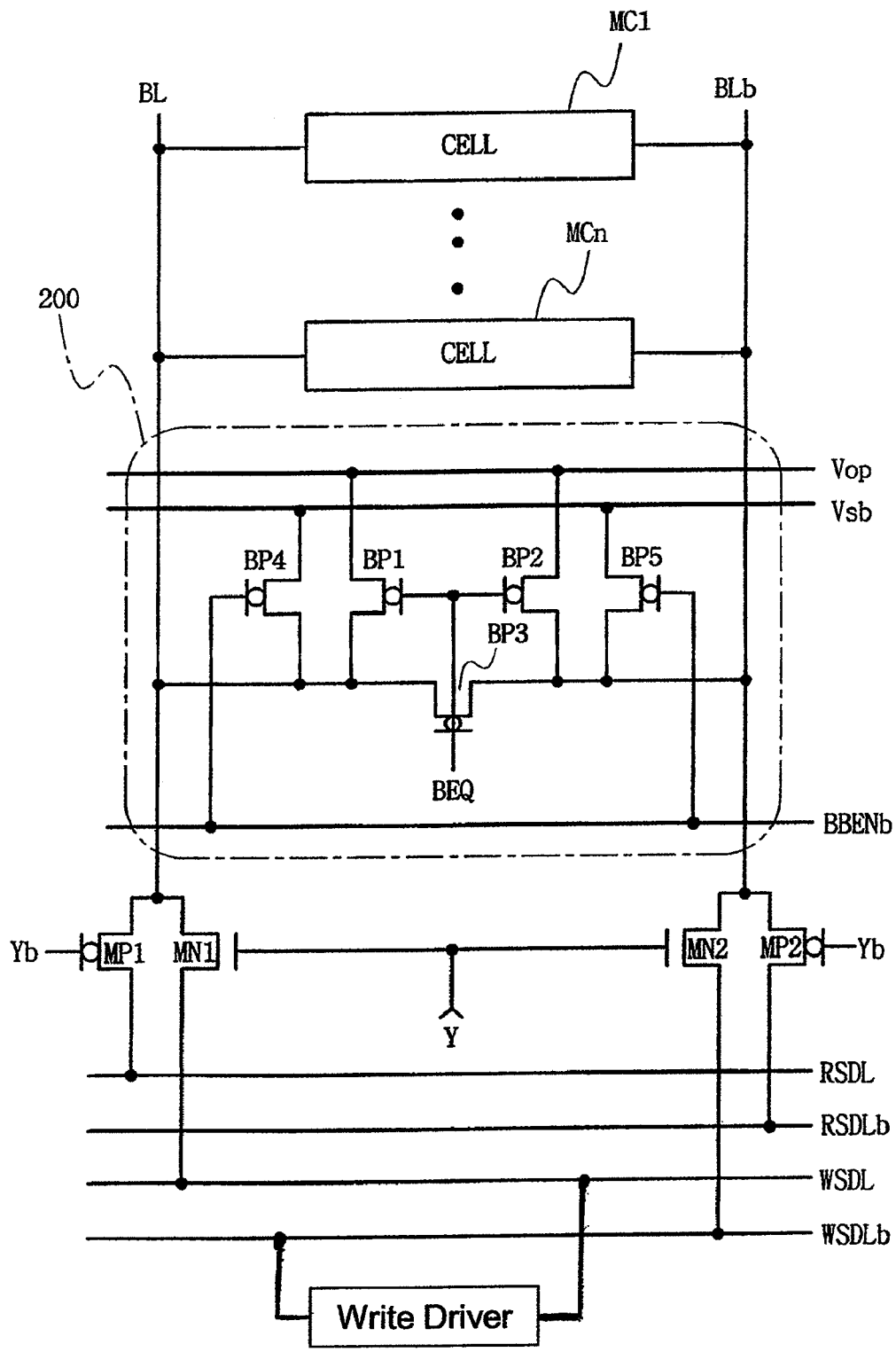
FIG. 3 is a circuit diagram showing a core cell array of a static random access memory according to an embodiment of the present invention.

FIG. 3 is a circuit diagram showing a core cell array of a static random access memory according to an embodiment of the present invention. The core cell array of FIG. 3 differs from that of FIG. 2 with the substitution of a bit line voltage switch 200 for the similar precharge and equalization section 100.

The bit line voltage switch 200 applies a first supply (operating) voltage Vop to a bit line pair BL and BLb in response to a first bit line voltage switch control signal BEQ. The bit line voltage switch 200 applies a second supply (standby) voltage Vsb having a level lower than that of the operating voltage Vop to the bit line pair BL and BLb in response to a second bit line voltage switch control signal BBENb. The bit line voltage switch 200 includes first, second, third and fourth bit line voltage switch precharge transistors BP1, BP2, BP4 and BP5. Source terminals of the first and second bit line voltage switch precharge transistors BP1 and BP2 are connected to the operating voltage Vop in common, drain terminals thereof are connected to the bit line pair BL and BLb, respectively, and gates thereof receive the first bit line voltage switch control signal BEQ in common. Source terminals of the third and fourth bit line voltage switch precharge transistors BP4 and BP5 are connected to the standby voltage Vsb in common, drain terminals thereof are connected to the bit line pair BL and BLb, respectively, and gates thereof receive the second bit line voltage switch control signal BBENb. The bit line voltage switch 200 further includes a bit line voltage switch equalization transistor BP3. The bit line voltage switch equalization transistor BP3 includes a gate for receiving the first bit line voltage switch control signal BEQ, and a source-drain channel of the bit line voltage switch equalization transistor BP3 is connected between the drains of the first and second bit line voltage switch precharge transistors BP1 and BP2.

A bit line voltage controller (not shown) controls states of the first and second bit line voltage switch control signals BEQ and BBENb so that the standby voltage Vsb is supplied to the bit line pair BL and BLb during a standby mode, and the operating voltage Vop is supplied to the bit line pair BL and BLb when the semiconductor memory device changes from the standby mode to an operational mode for a predetermined time period. When the level of the operating voltage Vop is approximately 1.8 volts, the level of the standby voltage Vsb may be approximately 1.0 to 1.2 volts.

When the core cell array of FIG. 3 enters a standby mode, the second bit line voltage switch control signal BBENb at a low logic level and the first bit line voltage switch control signal BEQ at a high logic level are applied to the bit line voltage switch 200. Accordingly, the third and fourth bit line voltage switch precharge transistors BP4 and BP5 are turned on, with the result that the standby voltage Vsb, which is lower than the operating voltage Vsb, is supplied to the bit line pair BL and BLb. Because the first bit line voltage switch control signal BEQ at a high level is applied to the bit line voltage switch 200, the first and second bit line voltage switch precharge transistors BP1 and BP2, and the bit line voltage switch equalization transistor BP3 are turned off. Consequently, since the operating voltage Vop is not supplied to the bit line pair BL and BLb during the standby mode, the bit line pair BL and BLb is precharged to the level of the standby voltage Vsb.

A voltage of about 1.0 volt precharges the bit line pair BL and BLb in this embodiment of the present invention. Accordingly, this embodiment of the present invention reduces the amount of leakage current flowing through the first and second pass transistors N3 and N4 of a memory cell MC as shown in FIG. 1, in comparison to a conventional circuit which precharges with a voltage of about 1.8 volts.

When the core cell array of FIG. 3 changes from the standby mode to the operational mode, to maintain the bit line pair BL and BLb at a voltage level of the operating voltage Vop, the second bit line voltage switch control signal BBENb at a high logic level and the first bit line voltage switch control signal BEQ at a low logic level are applied to the bit line voltage switch 200. Accordingly, the first and second bit line voltage switch precharge transistors BP1 and BP2 and the bit line voltage switch equalization transistor BP3, which constitute the precharge and equalization section 100 of FIG. 2, are turned on, with the result that the voltage of the bit line pair BL and BLb is increased to the level of the operating voltage Vop. Here, an internal supply voltage generator (not shown) in a semiconductor memory device may provide the operating voltage Vop.

Figure 4:
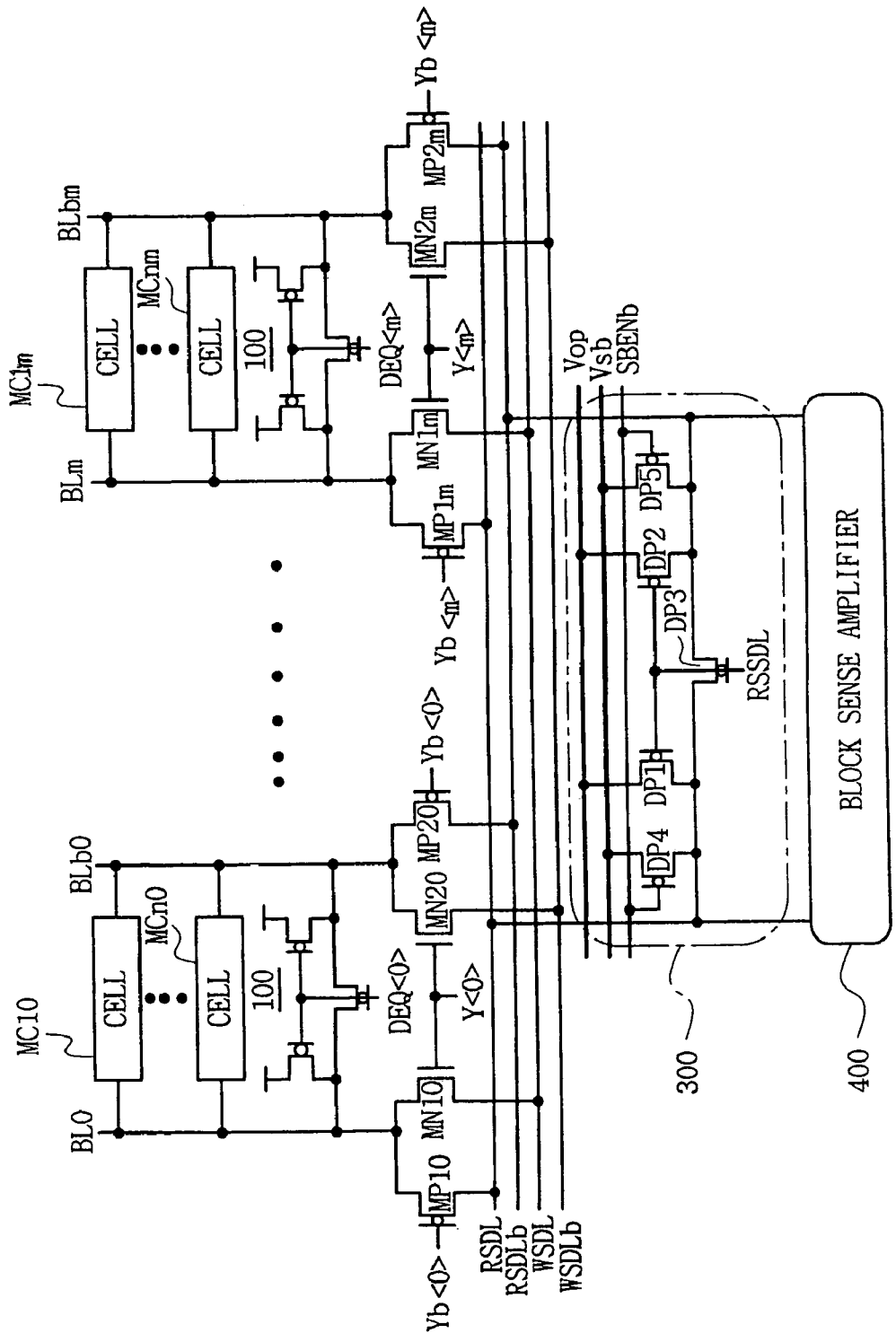
FIG. 4 is a circuit diagram showing a core cell array of a static random access memory according to another embodiment of the present invention.

FIG. 4 is a circuit diagram showing a memory cell block of a static random access memory according to another embodiment of the present invention. As shown in FIG. 3, a core cell array is one bit line pair BL and BLb having a plurality of memory cells MCn where the core cell array is considered a single column with each memory cell MCn in the column denoted by a row n in the column. Referring to FIG. 4, a plurality of bit line pairs BLm and BLbm each with a corresponding plurality of memory cells MCnm are configured as shown in FIG. 2 as a memory cell block, where the plurality of bit line pairs BLm and BLbm are considered columns m with the memory cells MCnm denoted by their row n and column m. Each memory cell block has one block sense amplifier 400 connected to the memory cell block.

A precharge and equalization section 100 is connected to each bit line pair BL<0:m> and BLb<0:m> that includes three pMOS transistors as in the precharge and equalization section 100 of FIG. 2. Unlike the operation of the precharge and equalization section 100 of FIG. 2, the precharge and equalization sections 100 in FIG. 4 does not operate in response to a precharge and equalization control signal YEQ during a standby mode. The precharge and equalization control signal YEQ of FIG. 2 is replaced by precharge interrupt control signals DEQ<0:m> in FIG. 4.

A data line voltage switch 300 is connected to a read section data line pair RSDL and RSDLb on two input terminals of a block sense amplifier 400. The data line voltage switch 300 applies an operating voltage Vop to the bit line pairs BL<0:m> and BLb<0:m> through first and second column pass gates MP1<0:m> and MP2<0:m> in response to a first applied switch control signal RSSDL. The data line voltage switch 300 also applies a standby voltage Vsb to the bit line pairs BL<0:m> and BLb<0:m> through the first and second column pass gates MP1<0:m> and MP2<0:m> in response to a second applied switch control signal SBENb. The data line voltage switch 300 in FIG. 4 has substantially the same circuit construction as that of the bit line voltage switch 200 in FIG. 3.

The data line voltage switch 300 includes first, second, third and fourth data line voltage switch precharge transistors DP1, DP2, DP4 and DP5. Source terminals of the first and second data line voltage switch precharge transistors DP1 and DP2 are connected to the operating voltage Vop in common, drain terminals thereof are connected to the read section data line pair RSDL and RSDLb, respectively, and gates thereof receive the first applied switch control signal RSSDL in common. Source terminals of the third and fourth data line voltage switch precharge transistors DP4 and DP5 are connected to the standby voltage Vsb in common, drain terminals thereof are connected to the read section data line pair RSDL and RSDLb, respectively, and gates thereof receive the second applied switch control signal SBENb. The data line voltage switch 300 further includes a data line voltage switch equalization transistor DP3. The data line voltage switch equalization transistor BP3 includes a gate for receiving the first applied switch control signal RSSDL, and a source-drain channel of the data line voltage switch equalization transistor DP3 is connected between the drains of the first and second data line voltage switch precharge transistors DP1 and DP2.

A data line voltage controller (not shown) controls states of precharge interrupt control signals DEQ<0:m>, and the first and second applied switch control signals RSSDL and SBENb so that the standby voltage Vsb is supplied to the bit line pairs BL<0:m> and BLb<0:m> during a standby mode, and the operating voltage Vop is supplied to the bit line pairs BL<0:m> and BLb<0:m> when the semiconductor memory device changes from the standby mode to an operational mode for a predetermined time period. A construction and operation of the data line voltage controller will be explained below by reference to FIG. 5, FIG. 6, FIG. 7A and FIG. 7B.

Figure 5:
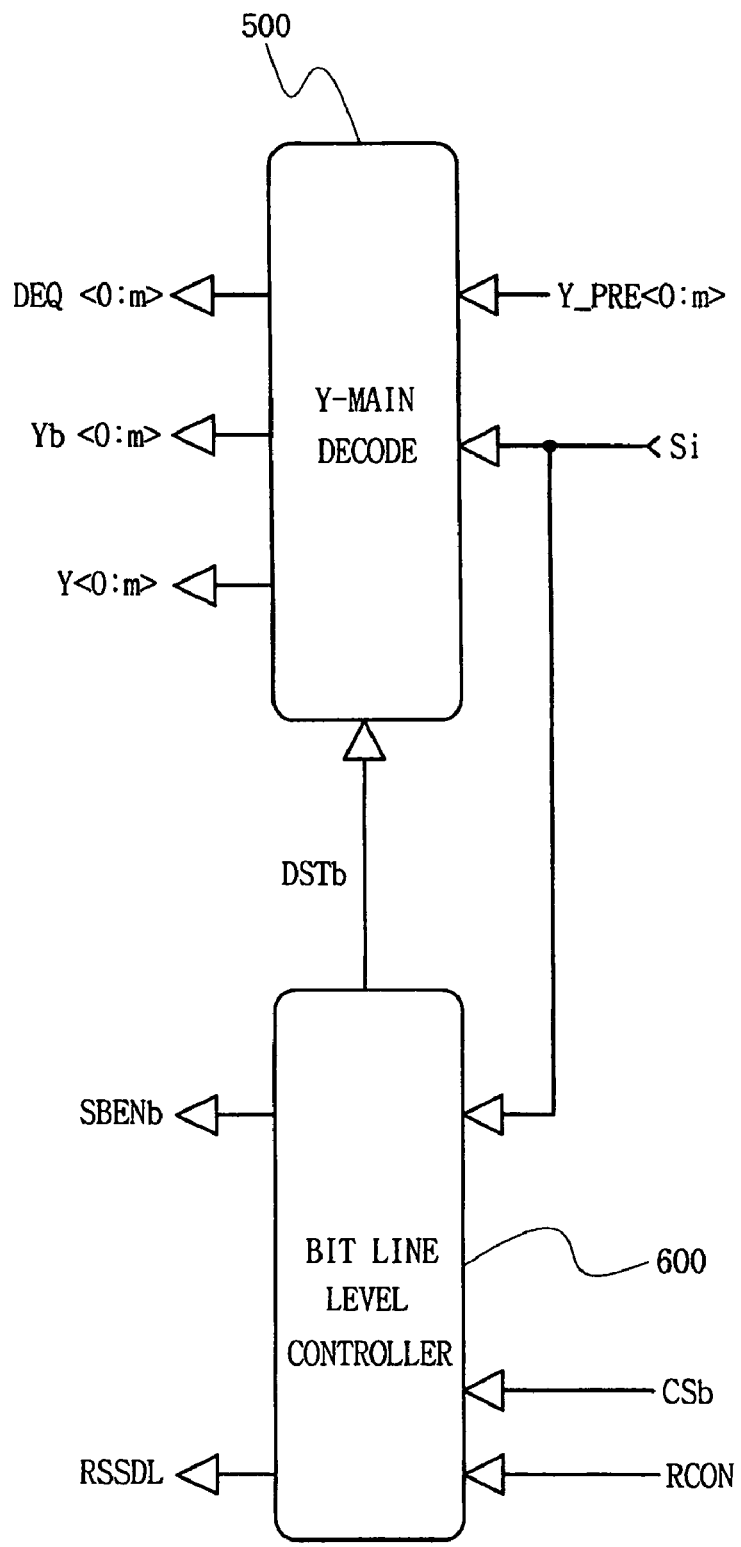
FIG. 5 is a circuit diagram showing a data line voltage controller according to an embodiment of the present invention.
Figure 6:
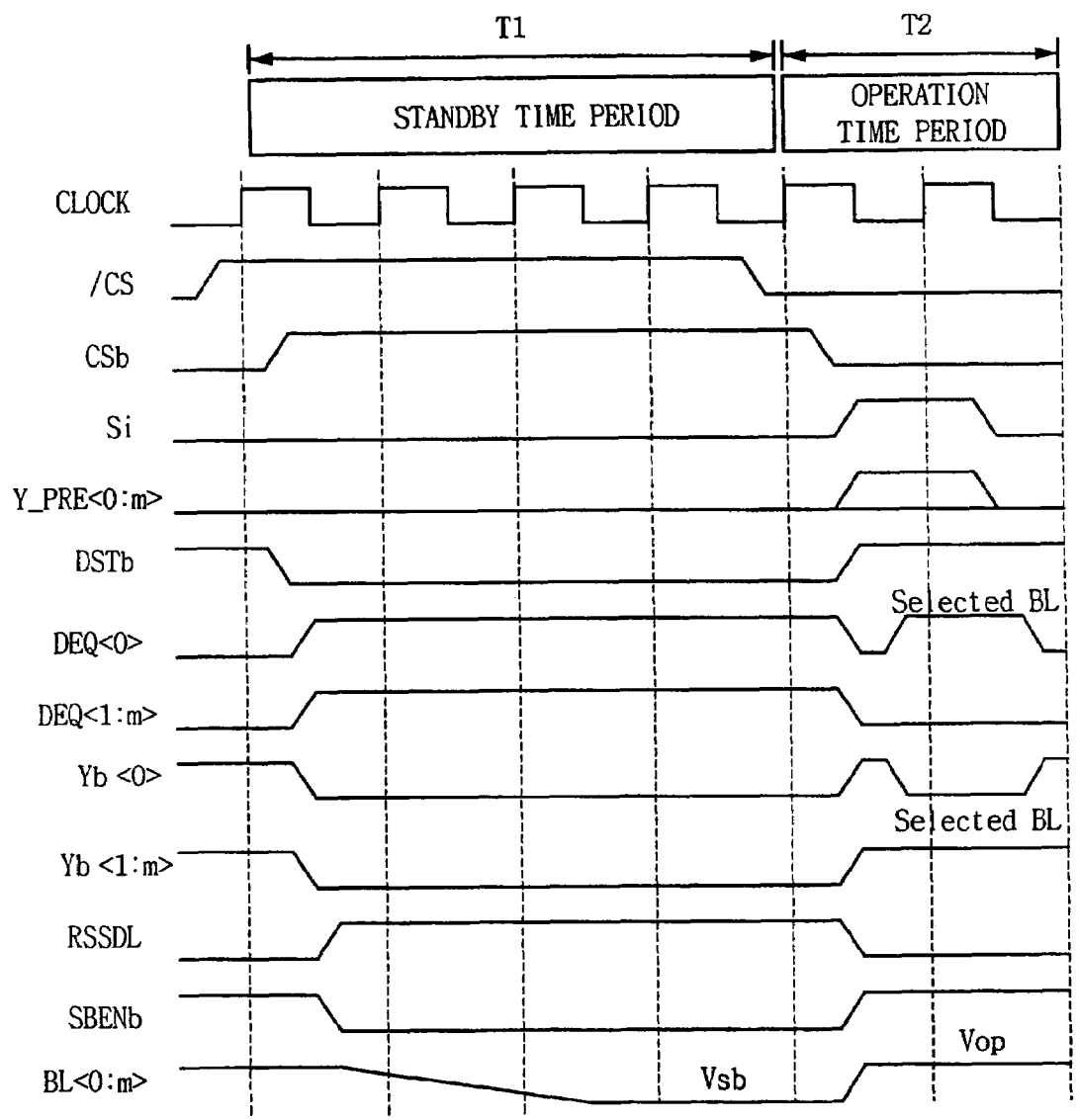
FIG. 6 is a timing diagram that illustrates the operation of the core cell array of a static random access memory as in FIG. 4.
Figure 7A:
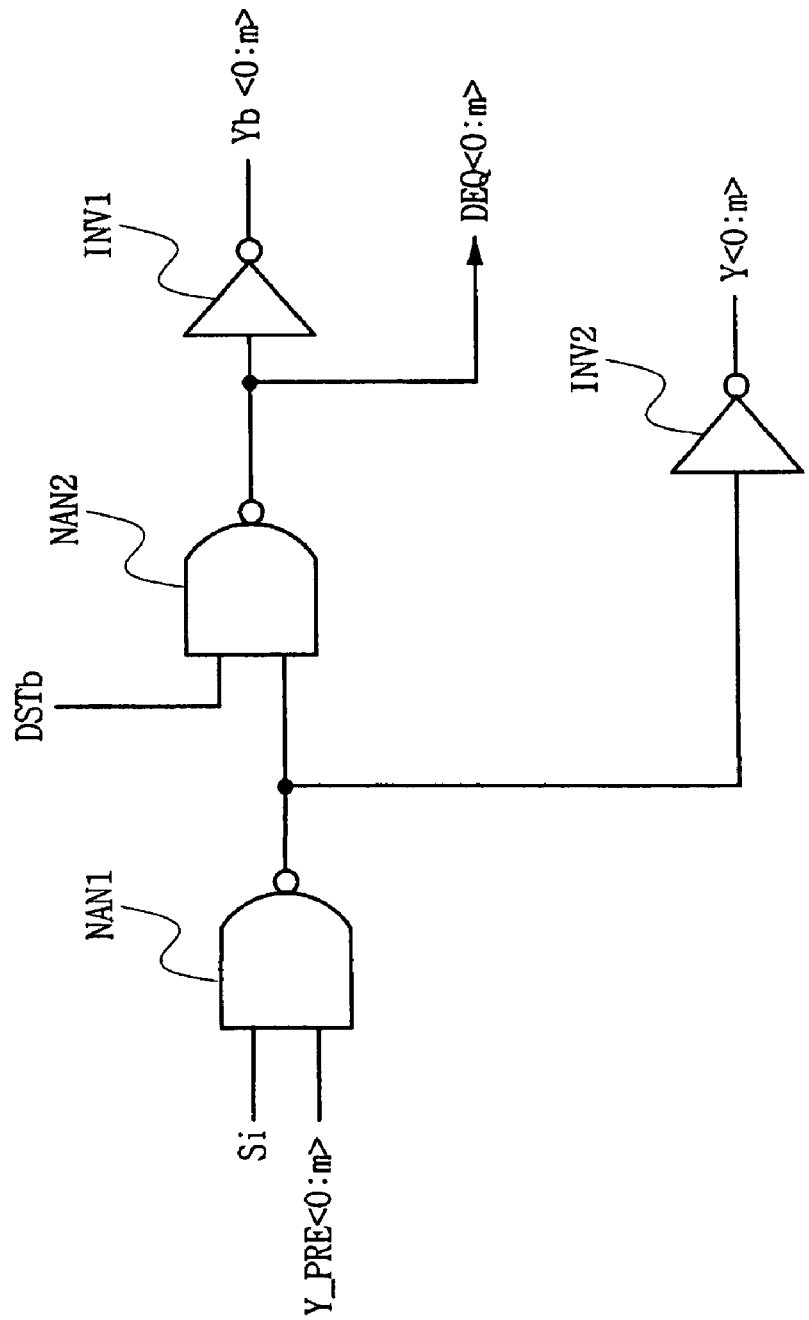
FIGS. 7A and 7B are circuit diagrams of the Y-main decoder and the bit line level controller portions of the data line voltage controller shown in FIG. 5, respectively.
Figure 7B:
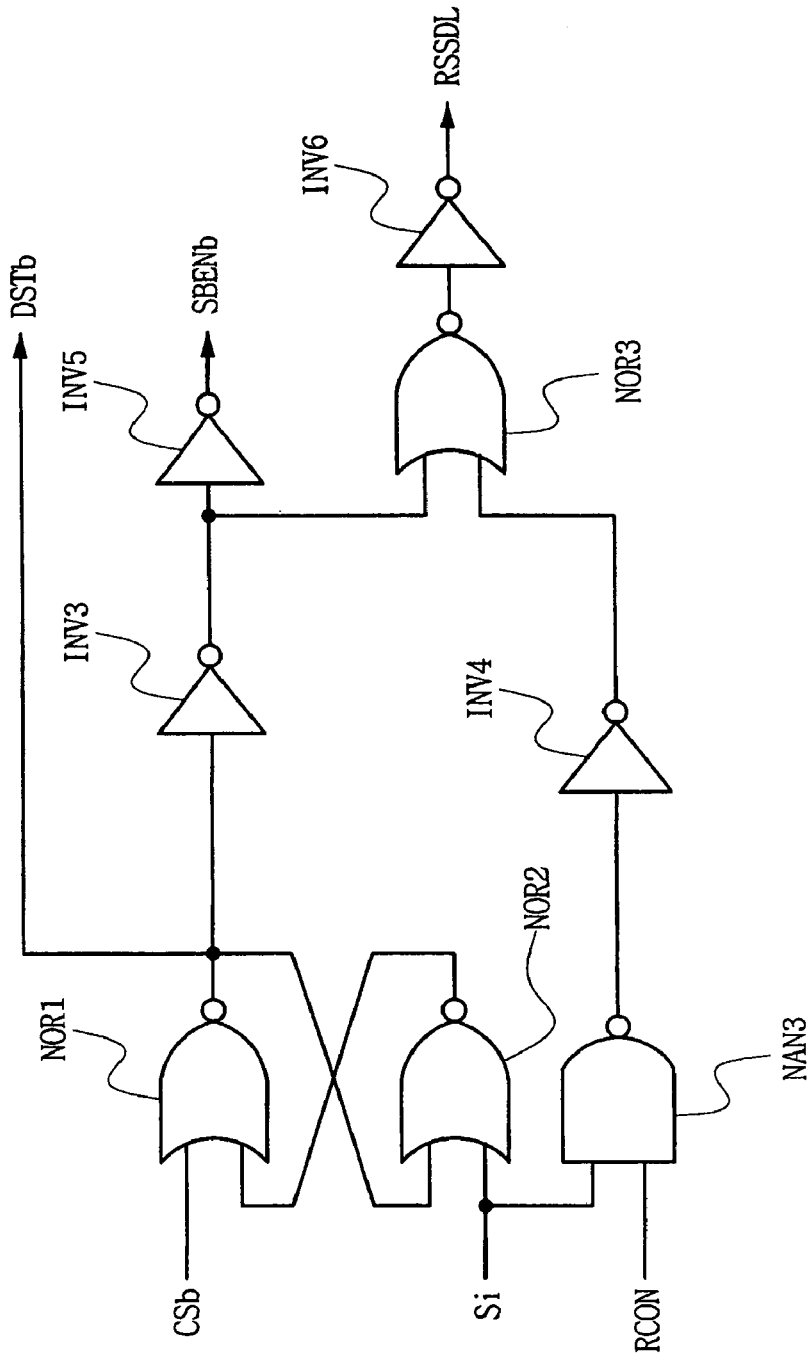

FIG. 5 is a circuit diagram showing a data line voltage controller according to an embodiment of the present invention. FIG. 6 is a timing diagram that illustrates the operation of the core cell array of a static random access memory as in FIG. 4. FIGS. 7A and 7B are circuit diagrams of the Y-main decoder and the bit line level controller portions of the data line voltage controller shown in FIG. 5, respectively.

With reference to FIG. 5, FIG. 7A and FIG. 7B, the data line voltage controller includes a Y-main decoder 500 and a bit line level controller 600. The Y-main decoder 500 generates the precharge interrupt control signals DEQ<0:m> using a block select signal Si, a bit line select signal Y_PRE<0:m>, and a chip select association signal DSTb. The bit line level controller 600 generates the chip select association signal DSTb, and the first and second applied control signals RSSDL and SBENb in response to the block select signal Si, a read control signal RCON, and a chip select signal CSb.

Referring to FIG. 7A, the Y-main decoder 500 includes a first NAND gate NAN1, a second NAND gate NAN2, a first inverter INV1, and a second inverter INV2. The first NAND gate NAN1 receives the block select signal Si and the bit line select signal Y_PRE<0:m>. The second NAND gate NAN2 receives the output of the first NAND gate NAN1 and the chip select association signal DSTb, and outputs the precharge interrupt control signals DEQ<0:m>. The first inverter INV1 inverts the output of the second NAND gate NAN2 and outputs the complementary column select signals Yb<0:m>. The second inverter INV2 inverts the output of the first NAND gate NAN1 and outputs the column select signals Y<0:m>.

Referring to FIG. 7B, the bit line level controller 600 includes first and second NOR gates NOR 1 and NOR 2 constituting a latch circuit, a third NAND gate NAN3, third to fifth inverters INV3 to INV5, a third NOR gate NOR3, and a sixth inverter INV6. The read control signal RCON may be prepared to be output as a high logic level by combining the chip select signal CSb and a write enable signal in a read operation mode. The bit line level controller 600 operates by the latch circuit comprised of the first and second NOR gates NOR1 and NOR2. The latch circuit receives the chip select signal CSb and the block select signal Si and outputs the chip select association signal DSTb. The third NAND gate NAN3 receives the read control signal RCON and the block select signal Si. The third inverter INV3 inverts the output of the latch circuit and the fourth inverter INV4 inverts the output of the third NAND gate NAN3. The fifth inverter inverts the output of the third inverter INV3 and outputs the second applied switch control signal DBENb. The third NOR gate NOR3 receives the output of the third inverter INV3 and the output of the fourth inverter INV4. The sixth inverter INV6 inverts the output of the third NOR gate NOR3 and outputs the first applied switch control signal RSSDL.

In the bit line voltage switch of FIG. 3, the construction of the bit line voltage controller is substantially the same as the data line voltage controller of FIG. 5. The Y-main decoder 500 provides the first bit line voltage switch control signal BEQ. The second applied control signal SBENb is the same as the second bit line voltage switch control signal BBENb.

Referring to FIG. 4, an operation of the core cell array of an SRAM in a standby mode and an operational mode will be described with reference to FIG. 6. When the semiconductor memory device enters the standby mode, the second applied switch control signal SBENb is applied to the data line voltage switch 300 as a logic low, and the first applied switch control signal RSSDL and the precharge interrupt control signals DEQ<0:m> are applied thereto as logic highs. Furthermore, the complementary column select signals Yb<0:m> are applied to column pass gates MP1<0:m> and MP2<0:m> as logic lows. Accordingly, the third and fourth data line voltage switch precharge transistors P4 and P5 in the data line voltage switch 300 and column pass gates MP1<0:m> and MP2<0:m> are tuned on, whereas the first and second data line voltage switch precharge transistors DP1 and DP2, the data line voltage switch equalization transistor DP3 and the precharge and equalization section 100 are turned off. Consequently, the read section data line pair RSDL and RSDLb are precharged to the level of the standby voltage Vsb, and the standby voltage Vsb is also applied to the bit line pairs BL<0:m> and BLb<0:m> through the column pass gates MP1<0:m> and MP2<0:m>. The bit line pairs BL<0:m> and BLb<0:m> are precharged to the level of the standby voltage Vsb, which is lower than that of the operation voltage Vop, in the standby mode, with the result that leakage current flowing through the first and second pass transistors N3 and N4 of a memory cell MC as shown in FIG. 1 is reduced. Unlike a bit line voltage switch 200 as in FIG. 3, since the data line voltage switch 300 of FIG. 4 is installed for every block sense amplifier 400, there are substantially no penalties with respect to layout. Therefore, the data line voltage switch 300 of FIG. 4 is more applicable to a highly integrated semiconductor memory device.

Referring to FIG. 6, the bit line pair BL and BLb is precharged to the standby voltage Vsb during a standby time period T1. When the semiconductor memory device transitions from the standby time period T1 to an operational time period T2, the bit line pair BL and BLb is precharged to the level of the operating voltage Vop. The chip select signal CSb is controlled by an external chip select signal (not shown). When a chip is enabled, the chip select signal CSb becomes a logic low. In contrast to this, when the chip is disabled, the chip select signal CSb becomes a logic high. When the chip select signal CSb becomes a logic high, the chip select association signal DSTb becomes a logic low according to operation of the bit line level controller 600 of FIG. 7B. When the chip select association signal DSTb is low, the second switch control signal SBENb becomes a logic low but the first switch control signal RSSDL becomes a logic high. Accordingly, during the standby period T1, a supply of the operation voltage Vop is interrupted but a supply of the standby voltage Vsb, which is lower than the operation voltage Vop, is permitted. Here, once the semiconductor memory device changes from the standby mode to the operational mode by the block select signal Si and the chip select signal CSb for activating a cell array block, although a logic state of the block select signal Si transitions, an output node of the latch circuit is held at a high logic level by the latch structure of the bit line level controller 600 of FIG. 7B. Such an operation scheme prevents a circuit that has transitioned to the operational mode from frequently entering the standby mode and secures stability of operation. When the standby mode is held for longer than a predetermined time, the chip select signal CSb can be enabled. In this case, a standby detection circuit having a counter for counting the duration of the standby mode may be employed.

Figure 8:
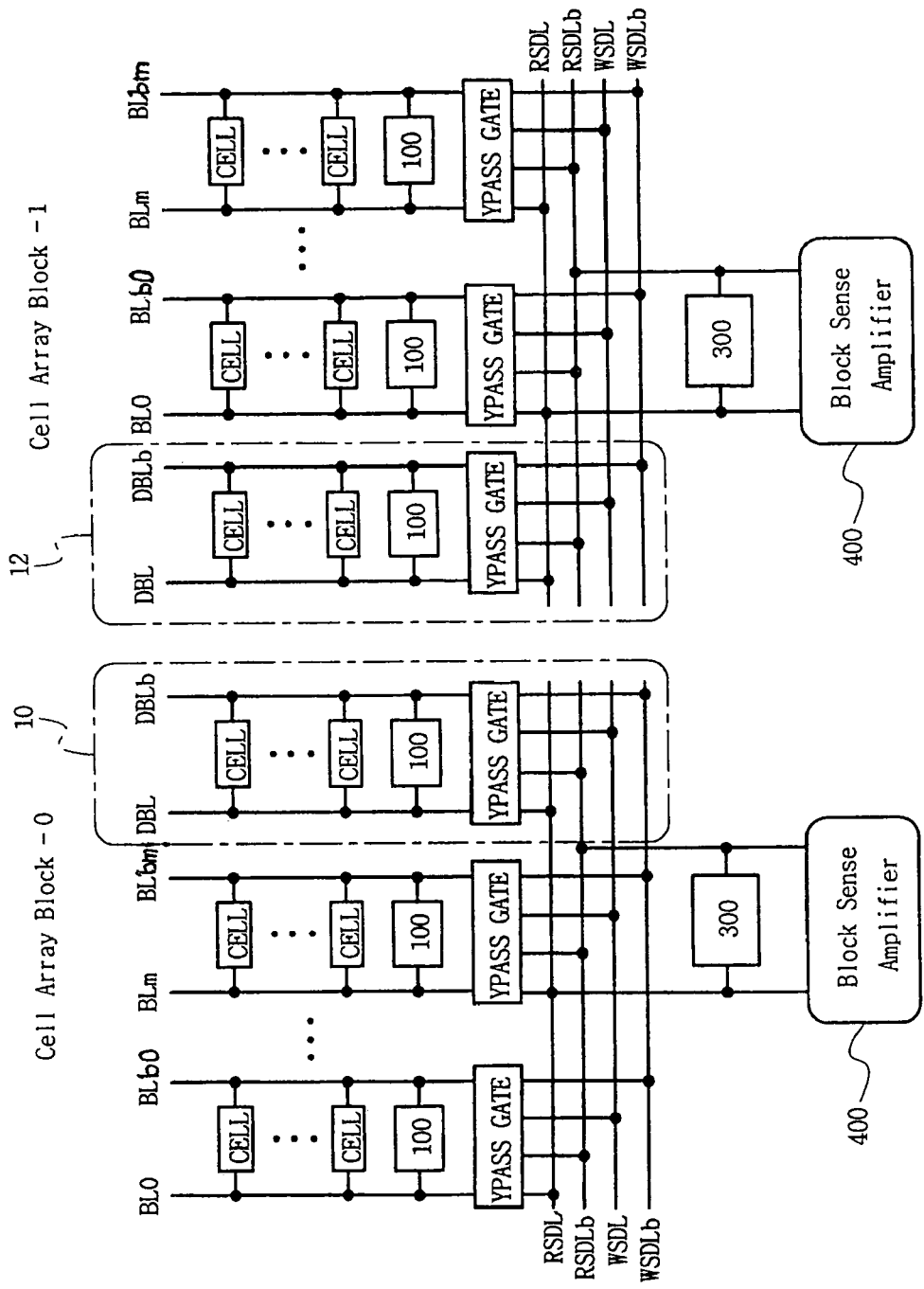
FIG. 8 is a circuit diagram showing a core cell array of a static random access memory according to still another embodiment of the present invention.

FIG. 8 is a circuit diagram showing a core cell array of a static random access memory according to still another embodiment of the present invention. Referring to FIG. 8, two cell array blocks are in place of one cell array block as in FIG. 4. Each cell array block of FIG. 8 has substantially the same construction as that of FIG. 4 except for the addition of dummy bit line blocks 10 and 12. In the case where the dummy bit line blocks 10 and 12 arranged between the cell array blocks, and between cell blocks of an input/output (I/O) unit, when the semiconductor memory device changes from a standby mode to an operational mode, a voltage of a dummy bit line pair DBL and DBLb changes from the level of the standby voltage Vsb to the level of the operating voltage Vop as in a conventional bit line pair BL and BLb. Accordingly, when the semiconductor memory device changes to the operational mode, coupling capacitances of bit lines disposed at an edge of a memory cell, that is a bit line BLbm of a cell array block 0 and a bit line BL0 of a cell array block 1 in a case of FIG. 8, have the same value as those of other bit lines. As discussed above, the coupling capacitances of bit lines disposed at an edge of a memory cell have the same value as those of other bit lines by using additional dummy bit lines. Consequently, when the semiconductor memory device changes to the operational mode, a voltage supply operation to all the bit lines is performed in the same manner, so that performance of a device is stabilized.

As a result, leakage current flowing through a pass transistor is reduced in the standby mode. Further, when the semiconductor memory device changes to the operational mode, the operation is stably performed.

Figure 9:
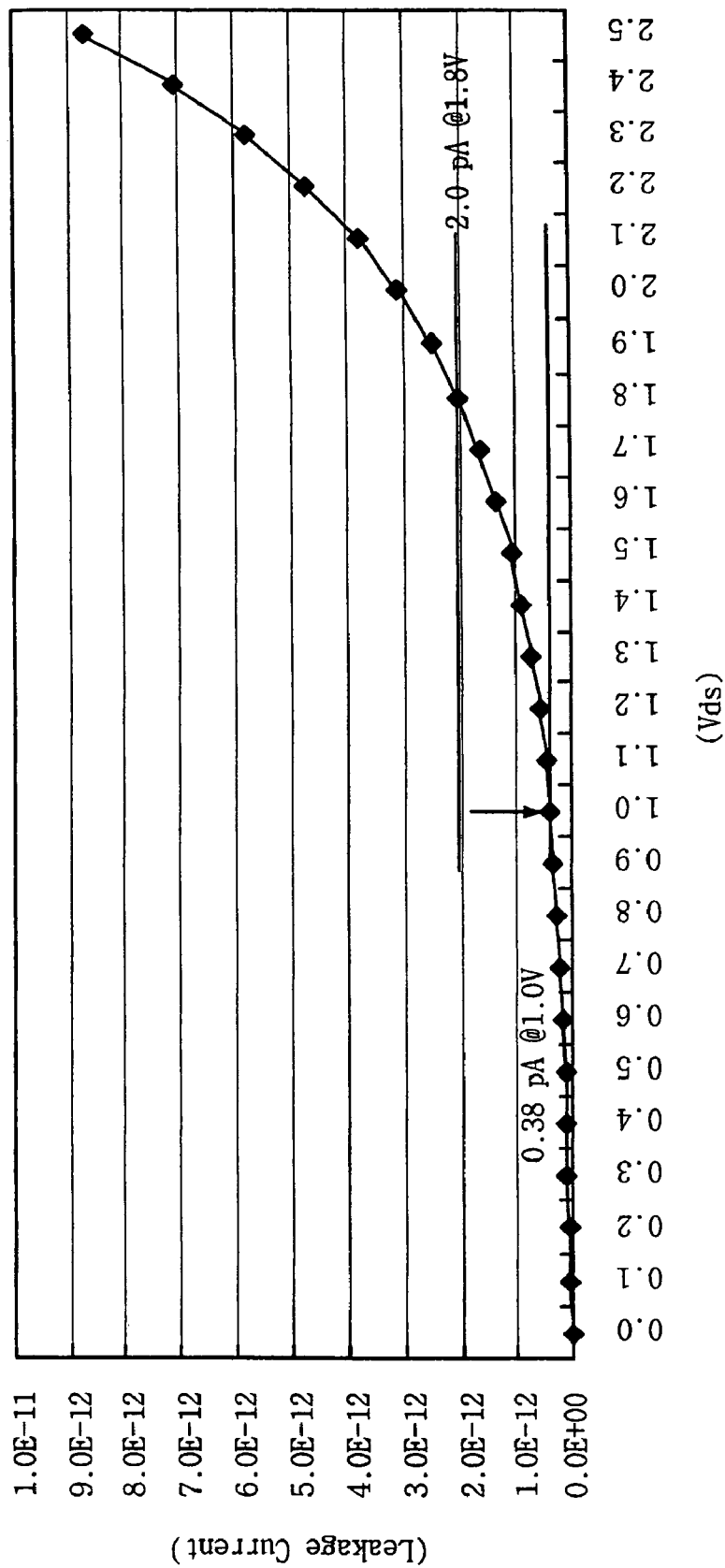
FIG. 9 is a graph showing a reduction effect of leakage current according to the present invention.

FIG. 9 is a graph showing a reduction effect of leakage current according to the present invention. In FIG. 9, the horizontal axis indicates the voltage across the drain and the source of a pass transistor in a memory cell, and the vertical axis indicates the amount of leakage current. As shown in the graph of FIG. 9, when a bit line voltage is approximately 1.8V, the leakage current is about 2.0 pA. However, when the semiconductor memory device enters into the standby mode where the bit line voltage is reduced to about 1.0V, the leakage current is reduced to about 0.38 pA. Accordingly, in a high density memory, for example, a 128 Mb memory, the standby current flowing through an access transistor of the memory may be reduced from about 256 µA to about 48.64 µA.

Therefore, according to the present invention, by controlling a precharge voltage level of bit lines at two levels, the leakage current is minimized, whereby the standby current is reduced to about the maximum extent. Upon changing to an operational mode, the bit line voltage is rapidly returned to the level of the operation voltage, with a result that the AC characteristics are stabilized.

As described above, by applying a voltage lower than an operation voltage in a standby mode, an electric current flowing through a memory cell is reduced. Furthermore, a standby current is reduced and a wake up time is quick without deteriorating the performance characteristics of the device. More particularly, in a static random access memory using six transistor memory cells, when a circuit of the present invention applies a precharge voltage to the bit lines, low power is easily achieved without a deterioration in the performance of the device.

The invention has been described using exemplary embodiments. However, it is to be understood that the scope of the invention is not limited to the disclosed embodiments. Detailed arrangements of transistors in voltage switch circuits and gate circuits indicate parts of an embodiment of the present invention. Other efficient methods employed by a circuit designer may be used. Changes may be made in this embodiment without departing from the scope and spirit of the invention as disclosed in the accompanying claims.

The scope of the present invention is intended to include various modifications and alternative arrangements. For example, in order to quickly reach a voltage potential of the bit lines held at the second supply voltage the standby voltage Vsb to a level of the operating voltage Vop, a voltage higher than the operation voltage Vop may be applied for a predetermined time period when the semiconductor memory device changes to the operational mode. After the high voltage is temporarily applied at a first stage of an operational time period, the case where the operation voltage Vop is applied, has a rapid wake up time in comparison with a case where an operation voltage Vop is applied as a precharge voltage of bit lines at a first state of the operational time period. This improves the performance of the semiconductor memory device.

In accordance with an exemplary embodiment, the operating voltage is identical to a level of a bit line precharge voltage, and the standby voltage level is generated by a write driver connected to a column pass gate.

What is claimed is:

1. A bit line voltage supply circuit in a semiconductor memory device, comprising:
    a bit line voltage switch for applying a first supply voltage to a bit line pair in response to a first switch control signal, and for applying a second supply voltage having a lower voltage than the first supply voltage to the bit line pair in response to a second switch control signal; and
    a bit line voltage controller for controlling the first and second switch control signals so that the second supply voltage is supplied to the bit line pair in a standby mode, and the first supply voltage is supplied to the bit line pair for a predetermined time period when the semiconductor memory device changes from the standby mode to an operational mode;
    wherein the bit line voltage controller includes:
    a Y-main decoder for generating the first switch control signal as an equalization and precharge control signal using a block select signal, a bit line select signal, and a chip select association signal; and
    a bit line level controller for generating the chip select association signal and the second switch control signal in response to the block select signal and a chip select signal.

2. The bit line voltage supply circuit according to claim 1, wherein the bit line voltage switch includes:
    first and second precharge transistors having source terminals that are connected to the first supply voltage, having drain terminals that are each connected to one of the bit lines of the bit line pair, and having gates for receiving the first switch control signal; and
    first and second drive transistors having source terminals that are connected to the second supply voltage, having drain terminals that are each connected to one of the bit lines of the bit line pair, and having gates for receiving the second switch control signal.

3. The bit line voltage supply circuit according to claim 2, further comprising an equalization transistor including a gate for receiving the first switch control signal, and a source-drain channel of the equalization transistor that is connected between the drains of the first and second precharge transistors.

4. The bit line voltage supply circuit according to claim 2, wherein the semiconductor memory device is a static random access memory, and the static random access memory includes a plurality of memory cells, each memory cell having six cell transistors.

5. The bit line voltage supply circuit according to claim 4, wherein the six cell transistors are a three-dimensional memory cell that is formed on different conductive layers.

6. A method of supplying a bit line voltage in a semiconductor memory device, comprising:
    generating the first switch control signal as an equalization and precharge control signal using a block select signal, a bit line select signal, and a chip select association signal;

generating the chip select association signal and the second switch control signal in response to the block select signal and a chip select signal;

in response to the first switch control signal, applying a standby voltage that is lower than an operating voltage to a bit line pair during a standby mode; and in response to the second switch control signal, applying the operating voltage to the bit line pair when the semiconductor memory device changes from the standby mode to an operational mode.

7. A method of supplying a bit line voltage in a semiconductor memory device, comprising:

applying a standby voltage that is lower than an operating voltage to a bit line pair during a standby mode; and applying the operating voltage to the bit line pair when the semiconductor memory device changes from the standby mode to an operational mode;

wherein the operating voltage is identical to a level of a bit line precharge voltage, and the standby voltage level is generated by a write driver connected to a column pass gate.

8. A method of supplying a bit line voltage in a semiconductor memory device, comprising:

applying a voltage lower than an operating voltage to a bit line pair of the semiconductor memory device in a standby mode to reduce a standby current;

applying a voltage higher than the operating voltage to the bit line pair for a predetermined time period when the semiconductor memory device changes from the standby mode to an operational mode; and applying the operating voltage as the bit line voltage when the predetermined time period elapses.

* * * * *